United States Patent
Kaesdorf et al.

(10) Patent No.: US 6,885,717 B2
(45) Date of Patent: Apr. 26, 2005

(54) DEVICE AND METHOD FOR DIGITALLY GENERATING EQUIDISTANT SYNCHRONOUS FREQUENCY-MULTIPLIED CLOCK PULSES

(75) Inventors: Oswald Kaesdorf, Grossenseebach (DE); Dietmar Wanner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 765 days.

(21) Appl. No.: 09/918,614

(22) Filed: Jul. 31, 2001

(65) Prior Publication Data

US 2002/0061083 A1 May 23, 2002

(30) Foreign Application Priority Data

Nov. 17, 2000 (DE) .......................................... 100 57 026

(51) Int. Cl.[7] ................................................ H04L 7/04
(52) U.S. Cl. ...................................... 375/362; 375/354
(58) Field of Search ................................ 375/362, 355, 375/354, 373, 376; 327/156, 159

(56) References Cited

U.S. PATENT DOCUMENTS

| | | | | |
|---|---|---|---|---|
| 4,598,257 A | * | 7/1986 | Southard | 331/2 |
| 5,003,559 A | * | 3/1991 | Kanai et al. | 375/358 |
| 6,154,508 A | * | 11/2000 | Ott | 375/354 |
| 6,163,185 A | * | 12/2000 | Deluigi et al. | 327/156 |
| 6,304,623 B1 | * | 10/2001 | Richards et al. | 375/355 |
| 6,603,830 B1 | * | 8/2003 | Finsterbusch et al. | 375/362 |

FOREIGN PATENT DOCUMENTS

DE              19932635          8/2000

* cited by examiner

Primary Examiner—Khai Tran
(74) Attorney, Agent, or Firm—Baker Botts L.L.P.

(57) ABSTRACT

Uniform distribution of a correction determined by a PLL over the subordinate clock signals is undertaken by dividing a phase-regulated value by the number of subordinate clock signals. Division by way of successive addition is performed such that time conflicts with subordinate clock signals generated in real time are successfully avoided despite the required time duration of such a division. The synchronicity can be further raised by also uniformly distributing a division remainder. A particularly effective implementation of this division employs subsequent rounding for real time use.

14 Claims, 6 Drawing Sheets

DEVICE AND METHOD FOR DIGITALLY GENERATING EQUIDISTANT SYNCHRONOUS FREQUENCY-MULTIPLIED CLOCK PULSES

FIELD OF THE INVENTION

The present invention relates to a synchronization method for a reception unit. More particularly, it relates to a method for generating equidistant clock pulses synchronously between two synchronization signals.

BACKGROUND OF THE INVENTION

In the past, there have existed various synchronization methods and the corresponding reception units. They have been used, inter alia, in fieldbus systems, for example the PROFIBUS. Such fieldbus systems are distributed control systems which generally have a transmission unit (head assembly, bus master) and a multiplicity of reception units (slaves). The individual slave assemblies are usually driven by virtue of the transmission unit transmitting an instruction message to the reception units. Upon receipt of the instruction message, the reception units output nominal values to a controlled technical installation which have been transmitted to them previously by the transmission unit. At the same time, they read in from the controlled technical installation actual values which they subsequently transmit to the transmission unit. The transmission unit then calculates new nominal values which it transmits to the individual reception units, so that the reception units are ready for the next instruction message.

The instruction messages are sent by the transmission unit with equidistant timing. From the instruction messages it is therefore possible to derive synchronization signals which can be used to synchronize the reception units to the transmission unit.

In practice, there is a time delay between transmission of the actual values read into the transmission unit and transmission of the nominal values to the reception units, on the one hand, and transmission of the next instruction message, on the other hand. This delay is generally used for "acyclic" messages. In this context, delays by the acyclic messages may cause individual instruction messages to be sent late. Reception of such delayed instruction messages may cause erroneous resynchronization of the reception units. In some applications, this erroneous resynchronization is not critical. However, in time-critical applications, erroneous resynchronization may be crucial. In time-critical applications, particularly when coupling interpolating drive axes, erroneous resynchronization cannot be tolerated.

For example, in German Patent Application DE 19932635.5 a PI controller as a phase regulator has been used to achieve sufficient accuracy in the synchronization with the transmission unit.

The phase regulator in a phase-locked loop (PLL) generates a stable clock signal essentially from a synchronization signal which is received via the fieldbus system and is subject to interference.

However, because of quartz drifting, the period length of the clock signal on the fieldbus system may deviate from the period length expected from the point of view of the PLL for the clock signal. The PLL must therefore continue to provide its own generated clock signals with corrections so that it remains synchronous with the synchronization signal of the transmission unit.

The synchronization signal is, moreover, subdivided by means of the PLL into a fixed number of high-frequency subordinate clock pulses. These subordinate clock pulses are generated with a set period length. However, in order to ensure synchronicity of these subordinate clock pulses with the superordinate synchronization signal, the correction determined by the PLL, which is essentially determined by the effects of the quartz drifts, is conventionally corrected, for the sake of simplicity, completely in the first of these subordinate clock pulses, depending on the synchronization signal. This results in a pulsating clock pattern in the case of the subordinate clock signals.

An example of the conventional mode of the resynchronization procedure is shown in FIG. 4 with the aid of a timing diagram in which the synchronization signal S and the subordinate clock signal u are plotted against time t. The synchronization signal S is expected in this case to be longer than that from the PLL. The subordinate clock signal u is generated by a multiple frequency n, from which intervals a result. In this case, a describes the nominal period of the subordinate clock signal u. Only the first interval a of the n subordinate clock signals in the example is correspondingly lengthened by a required correction value A1 of the phase regulator. It holds in this case that: A1>0.

FIG. 5, which has the same design in principle, shows the case when the synchronization signal S is shorter than that from the PLL. Then, only the first interval a of the n subordinate clock signals u in the example are correspondingly shortened by required correction value A2 of the phase regulator. It holds in this case that: A2<0.

In the case of time-critical applications, by contrast, particularly the coupling of interpolating drive axes already mentioned, this result with pulsating clock patterns is undesirable. The accuracy or precision of axes which are interpolating with respect to one another and are operated synchronously, for example in numerically controlled machine tools or robots, depends on the accuracy of the generated clock pulses.

In order to achieve the highest possible accuracy, it is necessary that the subordinate clock signals u be equidistant from one another exactly as are the synchronization signals S. Such an advantageous result is shown with the aid of FIG. 6, which illustrates the same signals which are shown in FIGS. 4 and 5, but now with equidistant intervals a*, which deviate from the nominal period length a, as a rule.

In many applications, the subordinate clock signals constitute, for example, the current regulator clock of drives. In this case, equidistant clock pulses have a direct effect on the "running smoothness" of the drives.

Accordingly, there remains a need for a method of synchronizing the clock pulses from a clock generator and the synchronization signals from reception units. It is, therefore, the object of the present invention to develop a synchronization method such that reception units can generate equidistant subordinate clock pulses.

SUMMARY OF THE INVENTION

In accordance with the present invention, this object is achieved by expanding the conventional synchronization method described at the beginning by virtue of the fact that the phase regulator corrects the clock generator such that the subordinate clock signals generated by the clock generator between two synchronization signals are essentially equidistant from one another. Furthermore, the determined instantaneous phase-regulated value is distributed virtually uniformly over the subordinate clock signals. Also, a respective correction value for each subordinate clock signal is determined by dividing the instantaneous phase-regulated value by the desired number of subordinate clock signals.

The invention therefore solves the specified technical problem by providing an equal distribution of the phase-regulated value determined by the PLL over the subordinate clock signals. In other words, the phase-regulated value is divided by the number of the subordinate clock signals.

Preferably, the division is performed by a successive addition with a count being kept as to how often the desired number of subordinate clock signals as divisor fits into the instantaneous phase-regulated value as dividend. An exceptionally effective time response of the synchronization is achieved thereby. This is preferable in hardware solutions where division operations can be complex.

In the case of software implementation, where a division can be carried out more simply and accurately, and rounding results can be distributed uniformly over the available clock pulses and can be processed (for example in a field/array). In the case of a hardware solution, a problem arises that the duration of counting depends basically on the division to be carried out, and can therefore come into temporal conflict with the subordinate clock signals which are to be generated simultaneously if the division is not included in good time.

However, this is excluded by the type of division described according to the invention, since the division requires a particularly large number of calculating clock pulses only when the correction need not be performed until very late in the case of the subordinate clock signals. In addition, a hardware solution has advantages by comparison with a software solution, because as a rule subordinate clock signals are to be generated with very short times in the range of, for example, 125 µs, 62.5 µs, 31.25 µs, and this requires a very highly prioritized software task which must deal with hardware matters (clock generation). This is unfavorable, and so a hardware solution is to be preferred.

In order to achieve a clock pattern of the subordinate clock signals which is as uniform as possible, it is to be recommended to distribute any possible division remainders in a likewise virtually uniform fashion over the subordinate clock signals. This can be implemented in a particularly effective way by carrying out the division up to the first decimal position and rounding the result off to an integral correction value.

It has proved to be particularly favorable in this case when the division is carried out by successive addition displaced by one bit by multiplying by the value two, and the result is used to decide whether to round up or round down, by virtue of the fact that the last addition possibly exceeding the dividend is repeated without displacement by one bit, and in the case when the dividend is exceeded the determined value is rounded down, or is otherwise rounded up.

According to a further advantageous refinement of the synchronization method according to the invention, after each generated subordinate clock pulse the division is carried out between two synchronization signals for the next subordinate clock pulse to be generated using as dividend the phase correction value reduced by the previous correction value and as divisor the value of a reduced number of subordinate clock pulses.

The phase-locked loop can be implemented in this case particularly effectively by virtue of the fact that the phase regulator integrates the instantaneous phase errors to form an integration value, an integration fraction being smaller than one, and the integration value serving as dividend for generating phase-regulated values.

In order to achieve an adjustment of a phase error which is as quick as possible, the phase regulator can correct the instantaneous phase errors to a proportional value, the proportional value being smaller than one and also serving as dividend, for generating phase-regulated values.

This holds chiefly when the proportional fraction is greater than the integration fraction. By virtue of the fact that inside the clock generator a clock generates primary clock signals which are fed to a frequency divider which outputs downwardly divided primary clock signals as subordinate clock signals on the output side, it is possible, moreover, to achieve that all components arranged between the clock generator and the clock signal counter are likewise synchronized in-phase.

The invention can therefore be implemented particularly advantageously in the form of generating subordinate clock signals and a virtually uniform distribution of an instantaneous phase-regulated value over the subordinate clock signals in real time.

In accordance with the invention, the object set at the beginning can also be achieved with the aid of a reception unit and with the aid of a communication system having at least one transmission unit and a plurality of such reception units for carrying out a synchronization method according to the type previously described.

Further advantages and details of the invention emerge from the following description of an advantageous exemplary embodiment, and in conjunction with the figures. In this case, elements of identical function are marked by the same reference symbols.

DETAILED DESCRIPTION OF THE DRAWINGS

Figure 1:
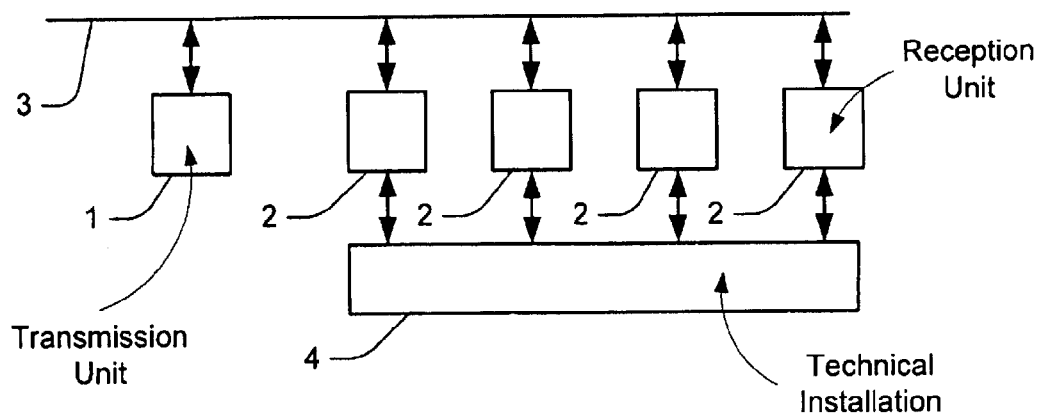
FIG. 1 is a block diagram illustrating an embodiment of a distributed control system.

In accordance with FIG. 1, a distributed control system has a transmission unit 1 and reception units 2 which are connected to one another via a bus system 3. The transmission unit 1 cyclically transmits messages to the reception units 2, which react appropriately to the received messages. For example, the reception units 2 read in input variables from a controlled technical installation or application 4, and output variables to the technical installation or application 4. This is indicated in FIG. 1 by the arrows between the reception units 2 and the technical installation/application 4.

Communication between the transmission unit 1 and the reception units 2 is performed as a rule according to the following, cyclically processed scheme:

Initially, the transmission unit 1 transmits output variables which are to be provided to the technical installation/application 4 to the reception units 2. Then transmission unit 1 transmits an instruction message to the reception units 2. In response to the instruction message, the reception units 2 provide the output variables to the technical installation 4 and read in input variables from the technical installation 4. The read-in input variables are then interrogated by the transmission unit 1.

The above scheme is preferably processed in a way which is strictly cyclical and rigorously equidistant in terms of time. In particular, the instruction messages can therefore be used as synchronization signals S, or synchronization signals S can be derived from the instruction messages. The reception units 2 can then be synchronized to the transmission unit 1 with the aid of the synchronization signals S.

Figure 2:
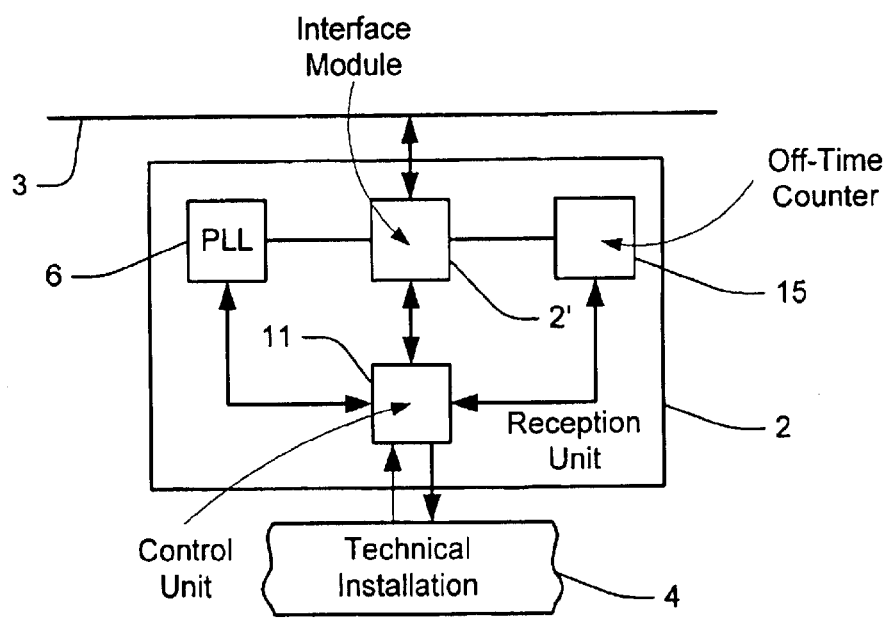
FIG. 2 is a block diagram of a reception unit.
Figure 3:
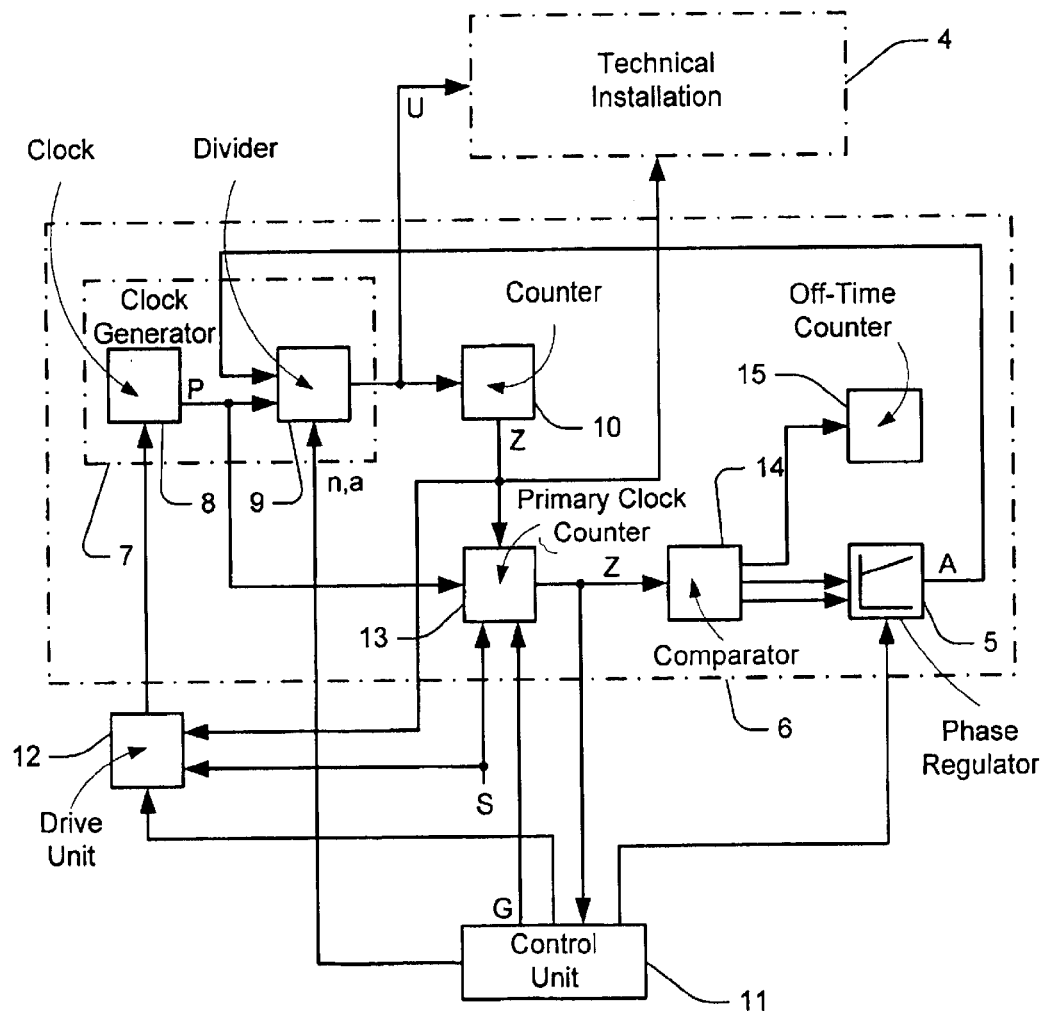
FIG. 3 is a block diagram presenting a phase-locked loop with digital generation of equidistant synchronous frequency-multiplied clock pulses.

The synchronization signals received by the reception units 2 are fed in accordance with FIGS. 2 and 3 to a phase regulator 5 of a phase-locked loop 6 via a bus interface module 2'. The phase-locked loop 6 has a clock generator 7. A clock 8 inside the clock generator 7 generates primary clock signals p, which are fed to a frequency divider 9. On the output side, the frequency divider 9 outputs the downwardly divided primary clock signals as subordinate clock signals u. The clock signals are fed to a clock signal counter 10 which then generates a signal Z.

In the event of ideal regulation of the frequency divider 9, the clock generator 7 outputs exactly one desired number n of clock signals between two synchronization signals S, and so Z and the synchronization signal S are synchronous. However, as a rule the clock generator 7 outputs a number n of subordinate clock signals u, and so the signal Z has a phase error by comparison with the synchronization signal S. Upon reception of the synchronization signals S and Z, the phase regulator 5 determines the instantaneous phase error z and then corrects the clock generator 7. The correction is performed such that it outputs the desired number n of subordinate clock signals u synchronously between two synchronization signals S, that is to say such that Z and S become synchronous.

Before the determination of the first instantaneous phase error z, a drive unit 12 is firstly prescribed a start signal by a control unit 11. The latter thereupon drives the clock 8 of the clock generator 7. When the clock signal counter 10 has counted the desired number n of clock signals, the clock signal counter 10 transmits a signal to the drive unit 12. Thereupon, the latter stops the clock 8 again. The phase-locked loop 6 is thereby "biased" so to say. Upon reception of the next synchronization signal S, which is likewise transmitted to the drive unit 12, the latter then starts the clock 8 again. The clock signal counter 10 is thereby newly incremented.

A primary clock counter 13 is informed that the desired number n has been reached and that the next synchronization signal S has arrived. The primary clock counter 13 is started upon arrival of the first of these two signals, and is stopped upon arrival of the second of the two signals. The counter reading (attended by a sign) of the primary clock counter 13 is therefore a direct measure of the error between the timing of the clock generator 7 and/or the signal Z and the periodicity of the synchronization signals S.

After the restarting of the clock generator 7 upon reception of the first synchronization signal S, the counter reading of the primary clock counter 13 is transmitted to the control unit 11. The control unit 11 calculates therefrom a correction value for driving the frequency divider 9, and prescribes this correction value directly to the phase regulator 5. The instantaneous phase error z detected during the first synchronization cycle is thereby at least substantially corrected.

In the further synchronization cycles, the primary clock counter 13 is always controlled as a function of the synchronization signal S and the achievement of the desired number n (that is to say the signal Z). Upon arrival of the first of these two signals, the primary clock counter 13 is started, and upon arrival of the second of these two signals it is stopped. The counter reading of the primary clock counter 13 is fed to a comparator 14.

The counter reading of the primary clock counter 13 is compared in terms of absolute value to a maximum error. If the counter reading exceeds the maximum error, an off-time counter 15 is incremented. No error signal is output to the phase regulator 5 in this case. The phase regulator 5 retains its previous output signal.

As a rule, the primary clock counter 13 is started or stopped with each transmission of a synchronization signal S. However, it is also possible for the control unit 11 additionally to transmit a validity signal G to the phase-locked loop 6. In this case, the primary clock counter 13 is started and stopped only whenever the validity signal G is present. It is, furthermore, possible to start and evaluate the primary clock counter 13 in a fashion offset by a phase offset with reference to the synchronization signal S.

A faster correction of the phase error results when the phase regulator 5 corrects the instantaneous phase error in relation to a proportional value, the proportional fraction being smaller than one. This holds, in particular, whenever the proportional fraction is greater than the integration fraction.

When the phase regulator 5 corrects the clock generator only if the absolute value of the instantaneous phase error does not exceed a maximum error, delays in the synchronization signals owing to acyclic messages do not cause erroneous correction of the clock generator.

A permanent fault in the communication between transmission unit 1 and reception unit 2 can, in particular, be detected when a counter is incremented upon overshooting of the maximum error.

When the control unit 11 transmits a validity signal to the phase-locked loop, and the synchronization method is executed only in the presence of the validity signal, it is to be ensured that the synchronization is performed on the correct synchronization signals.

When, inside the clock generator 7, a clock generates primary clock signals which are fed to a frequency divider 9 which, on the output side, outputs the downwardly divided primary clock signals as subordinate clock signals u, it is ensured that all the components arranged between the clock generator 7 and the clock signal counter 10 are likewise synchronized in-phase.

A particularly fast synchronization of the reception unit 2 results during startup when the clock generator 7 outputs the desired number of clock signals before the determination of the first instantaneous phase error and is then stopped and restarted upon reception of the next synchronization signal.

The synchronization at the start of the method is still further accelerated when, upon reception of the first synchronization signal after the restarting of the clock generator 7, the instantaneous phase error is at least substantially corrected and the integration of the instantaneous phase error and the correction of the integration value and, if appropriate, the correction of the instantaneous phase error is not executed until reception of the second synchronization signal.

In implementing the division in accordance with the invention, it is firstly to be observed that by contrast with multiplications, additions and subtractions a division is not generally possible in a primary clock pulse p in a computing means, for example an application-specific circuit ASIC. It is therefore necessary in principle for a division to be determined successively using an algorithm.

It is a simple, and therefore advantageous possibility to count how often the divisor fits into the dividend. This can be done, for example, as follows for a solution of 15/4:

| 0+4=4<15 | (1st addition) |
|---|---|
| 4+4=8<15 | (2nd addition) |
| 8+4=12<15 | (3rd addition) |
| 12+4=16>15 | (4th addition, too large)→result=3. |

Figure 7:
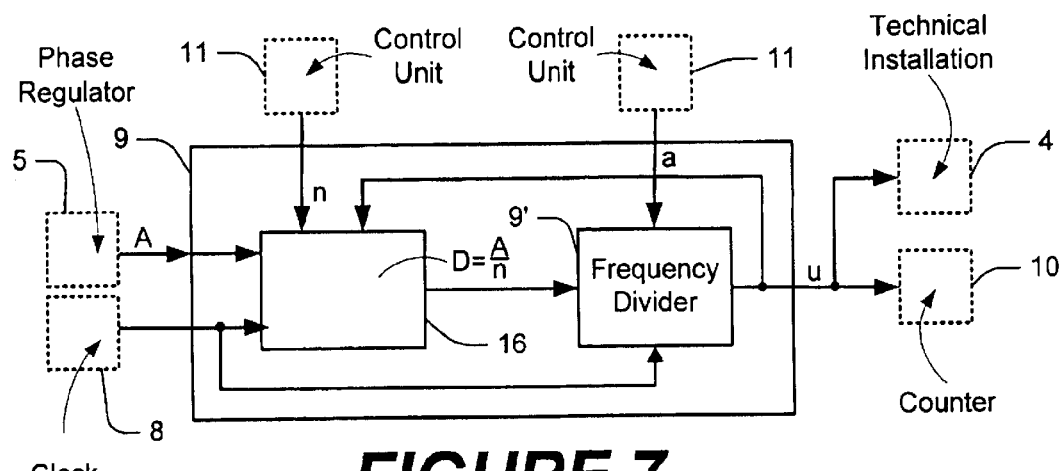
FIG. 7 is a block diagram of the clock generator from FIG. 3, with a dividing procedure according to the invention.

The block diagram of FIG. 7 further illustrates the design of the frequency divider 9 (FIG. 3) for implementing such a dividing procedure. The phase-regulated value A of the phase regulator 5, the desired number n of the subordinate clock signals u and the primary clock pulses p of the clock 8 serve as input signals for a block 16 for the dividing procedure, whose design is explained later in detail. Connected downstream of this block 16 is the actual frequency divider 9', its output signal being coupled back to the dividing procedure 16. In this case, a determined correction value D, which ideally corresponds to the quotient of the phase-regulated value A and desired number n, serves the frequency divider 9' as input signal in addition to the primary clock pulses p and the period length a.

Figure 4:
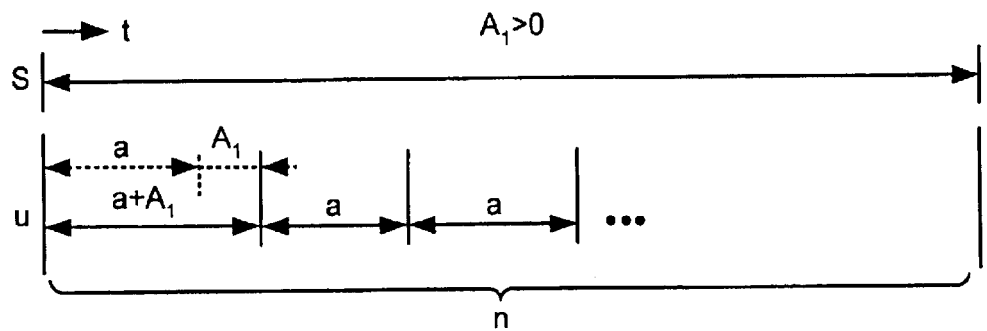
FIG. 4 is a timing diagram with conventional synchronous clock generation with a longer synchronization signal than that expected by the PLL.
Figure 5:
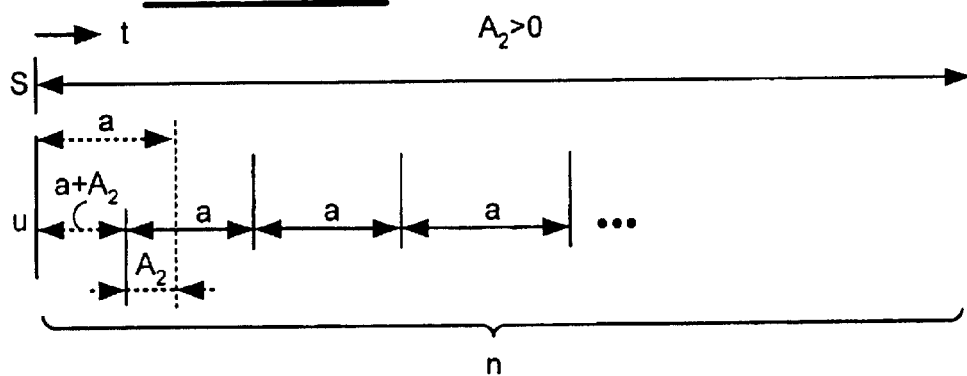
FIG. 5 is a timing diagram with conventional synchronous clock generation with a shorter synchronization signal than that expected by the PLL.
Figure 6:
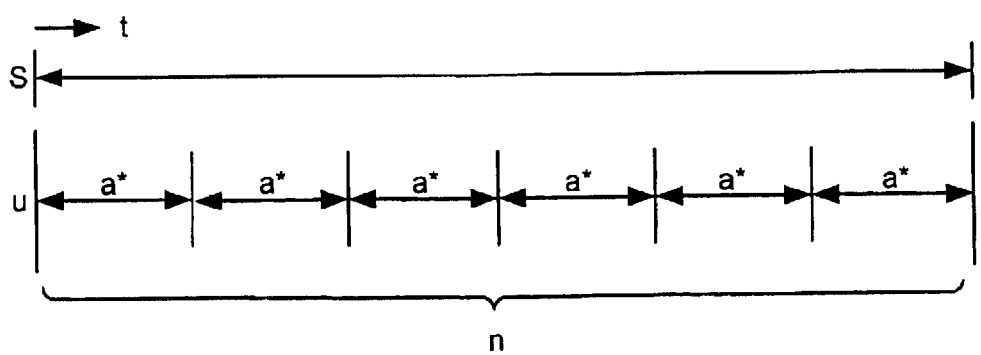
FIG. 6 is a timing diagram of the desired equidistant synchronous clock generation.

In accordance with FIGS. 4, 5 and 6, the following must then be fulfilled:

$$a^* n + A = S \quad (1)$$

Figure 8:
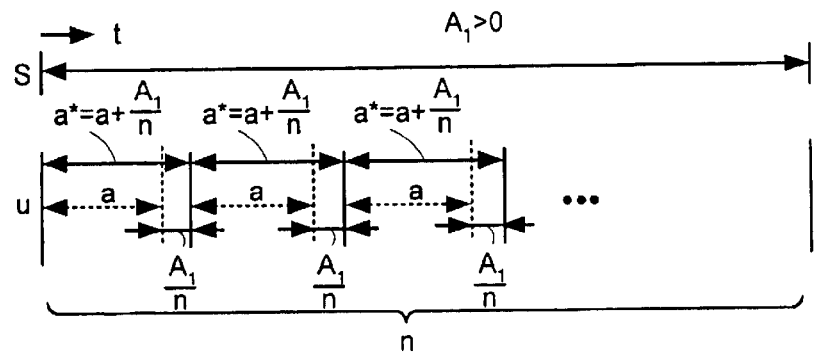
FIG. 8 is a timing diagram with a time response according to the invention for an equidistant synchronous clock generation with a longer synchronization signal than that expected by the PLL.
Figure 9:
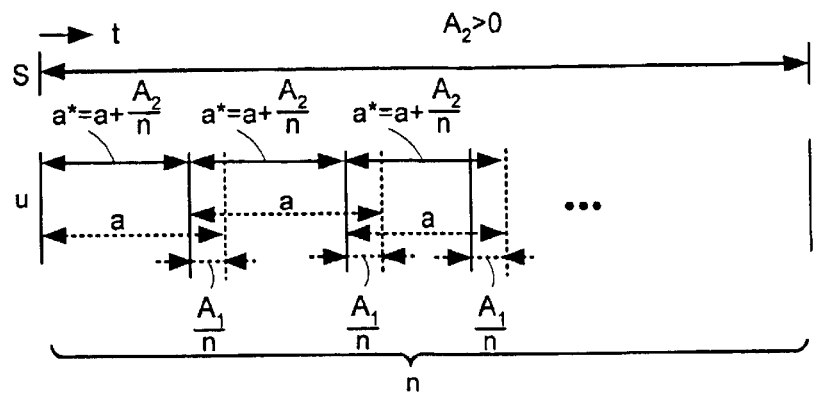
FIG. 9 is a timing diagram with a time response according to the invention for an equidistant synchronous clock generation with a shorter synchronization signal than that expected by the PLL.

The time response of the frequency divider 9' is illustrated in the timing diagram of FIGS. 8 and 9 along the lines of the illustrations according to FIGS. 4 and 5. FIG. 8 illustrates the case of FIG. 4 with a time response according to the invention for an equidistant synchronous generation of clock pulses with a longer synchronization signal S than that expected by the PLL 6. A phase-regulated value A1 supplied by the phase regulator 5 is greater than 0. A uniform distribution of A1 over the desired number n of subordinate clock signals u yields an equidistant synchronization by virtue of the fact that each interval a is lengthened in each case by the quotient of A1 and n. As a result, all n clock signals a* are situated in a fashion distributed equidistantly within the actual period length of the synchronization signal S.

FIG. 9 shows the case, corresponding to FIG. 5, of a timing diagram with a time response according to the invention for an equidistant synchronous clock generation with a shorter synchronization signal S than expected by the PLL 6. In this case, the phase-regulated value A2 supplied by the phase regulator 5 is smaller than 0. Each interval a is likewise respectively "lengthened" by the quotient of A2 and n, the desired shortening actually resulting because of the negative value of A2. As a result, all n clock signals a* are situated distributed equidistantly within the actual period length of the synchronization signal S in this case, as well.

The duration of the counting depends on the division to be carried out and can therefore in principle come into temporal conflict with the subordinate clock signals to be simultaneously generated, that is to say in a fashion parallel in time, if the division is not concluded in good time. However, this is ruled out in the present case, since the division according to the invention requires a particularly large number of operating clock pulses only when the correction need not be performed until very late in the case of the subordinate clock signals.

This is to be explained with the aid of two examples. Assume as a starting point that there is a maximum possible phase-regulated value of A=100 and the minimum number of subordinate clock signals is n=2. The division then lasts at most 50 primary clock pulses p and must, as a precondition, be shorter than the period length a of the subordinate clock signal u.

EXAMPLE 1

A current phase-regulated value A is 100, and the number n of subordinate clock signals is 4. The subordinate clock signals u are now nominally only half as long as prescribed at the starting point. The correction must therefore be performed at an appropriately earlier point. However, the division also only lasts half as long, specifically 25 primary clock pulses p. By contrast with the case of n=2, when n=4, there is a need for more intervals a to be generated in the same time and there is less time or fewer primary clock pulses p available for the division. With n=4, larger numbers are successively added on so the division can be performed correspondingly faster by successive addition. For this reason, the proposed type of division according to the invention is particularly advantageous for implementation in real time.

Figure 10:
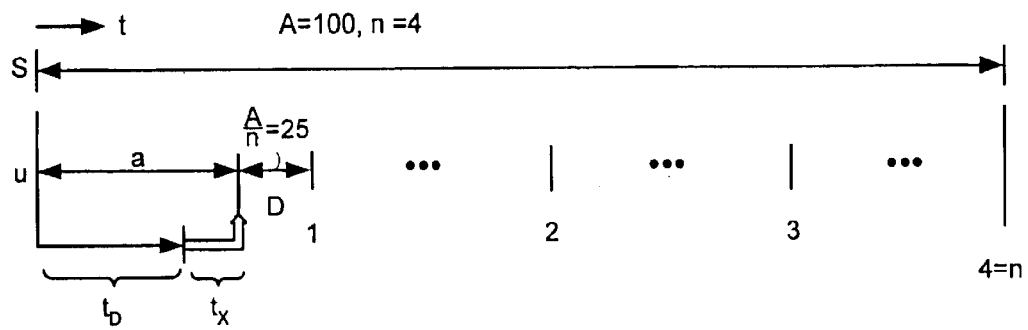
FIG. 10 is a timing diagram presenting a first example of the temporal sequence in the event of implementation of the dividing procedure by successive addition.

The example outlined is illustrated in FIG. 10, where the time response is shown in the case of implementation of the division by successive addition. The division is performed by successive addition in the time $t_D$ within each original interval a, it always being ensured that $t_D < a$. A time reserve tx always remains up to the instant at which the determined correction value D=A/n=25 must be processed.

A smaller correction value A<100 also leads to a shorter division period than the 25 primary clock pulses available above. This case is therefore already covered by the first example.

Even when A<0, that is to say in the most unfavorable case is −100, a+A/n=a−25 must be longer in temporal terms than $t_D$, so that tx>0 is available.

EXAMPLE 2

A current phase-regulated value A is 100, and the number n of subordinate clock signals is 25. The subordinate clock signals u are now more frequent or of high frequency, and the correction must therefore be performed at an appropriately earlier point. A higher number n of subordinate clock signals u therefore leads, precisely as does a smaller correction value A, to a shorter division period than the 25 operating clock pulses available above. However, this also reduces the time available for the division or the number of primary clock pulses p. However, by virtue of the fact that the division period now only requires 4 operating clock pulses, it is ensured in this case as well, that no collisions can occur in the case of calculation in real time. This is likewise illustrated graphically in FIG. 11. The design of the elements and references shown in FIG. 11 corresponds to those in FIG. 10.

It may therefore be stated in summary that the division period $t_D$ is proportional to the time a+D available, and that therefore there can be no temporal conflicts between the dividing and the generation of the subordinate clock signals u once the above described starting point is satisfied (that is to say tx is>0 in all situations).

According to the present invention, the handling of possible division remainders is also of great significance. Possible division remainders are also to be taken into account in order to generate the subordinate clock signals u synchronously with the synchronization signal S. For this purpose, such division remainders are likewise distributed uniformly over the subordinate clock pulses u, in order to obtain a clock pattern of the subordinate clock pulses u which is as uniform as possible. This is necessary since there are only integral primary clock pulses p.

Figure 11:
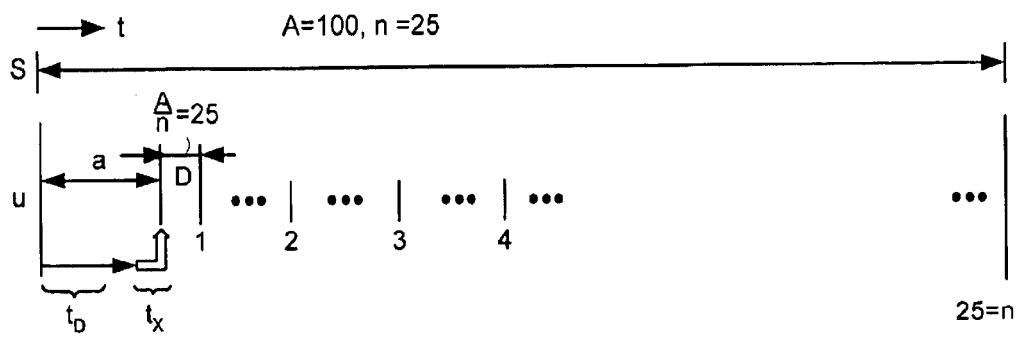
FIG. 11 is a timing diagram presenting a second example of the temporal sequence in the case of implementation of the dividing procedure by successive addition.

This problem does not arise in the cases shown with the aid of FIGS. 10 and 11, since these are based on integral values. However, A/n becomes 99/4=24.75 in the case of a phase-regulated value A=99, n=4. The handling of the division remainders is then performed such that 24 is corrected three times and 25 once on the n=4 clock pulses.

For A=98, n=4, the corresponding result is a correction of 24 twice and 25 twice, the following mode of procedure being chosen in order to obtain a clock pattern as uniform as possible:

n=1: correction 25
n=2: correction 24
n=3: correction 25
n=4: correction 24 or n=1: correction 24
n=2: correction 25
n=3: correction 24
n=4: correction 25 but not n=1: correction 25
n=2: correction 25
n=3: correction 24
n=4: correction 24 etc.

This can be implemented as follows according to the invention:

The division is carried out up to the first decimal position and then rounded (which means 15/4=4 and not 3 for the preceding example). For this purpose, the actual division is carried out by successive addition before carrying out the division in a fashion displaced by 1 bit (multiplied by 2) and it is finally decided whether to round up or down by adding without displacement by 1 bit. The complete solution of 15/4 then looks as follows: 15/4, displaced by 1 bit→solution of 30/8

0+8=8<30 (1st addition)

8+8=16<30 (2nd addition)

16+8=24>30 (3rd addition)

24+8=32>30 (4th addition, too large)→result at first is d=3;

rounding, the attempt being now to add not 8 but 4 in the case of the last still valid 3rd addition:

24+4=28<30, that is to say rounding up→result D=4.

Here, D constitutes the rounded division of d.

Figure 12:
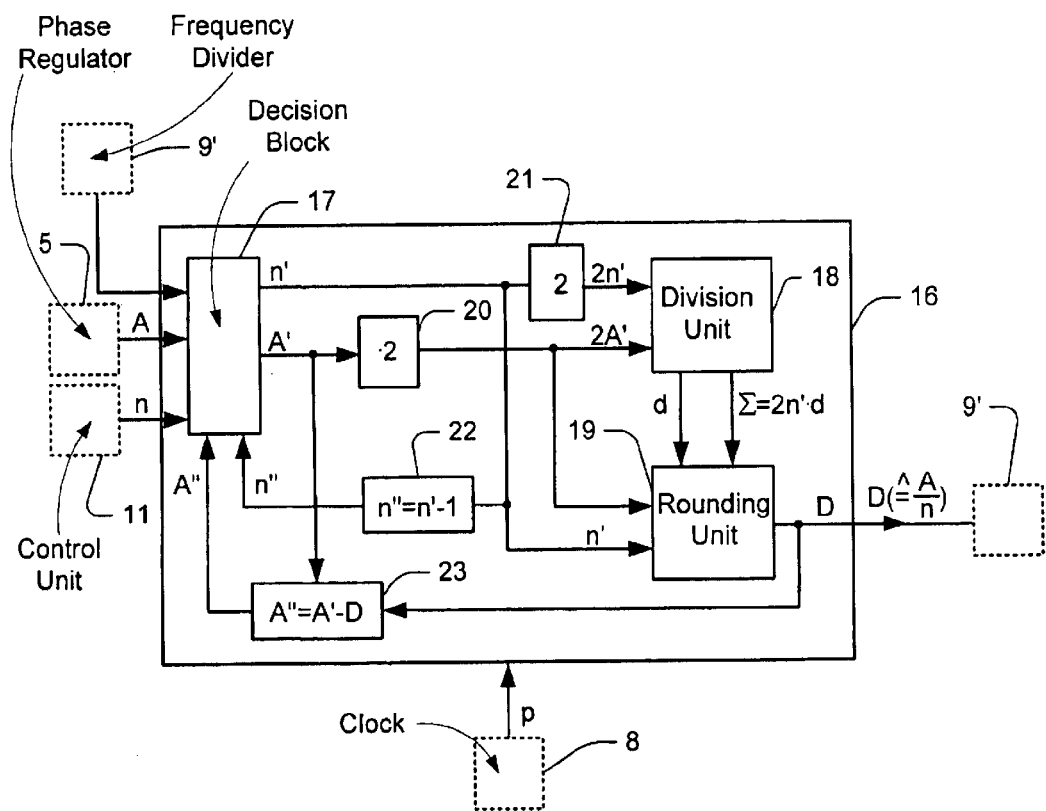
FIG. 12 is a block diagram of a technical implementation of the dividing procedure according to the invention.

A possible technical implementation of such a division, for example in the form of an ASIC, is illustrated as a block diagram in FIG. 12, the division block denoted by 16 in FIG. 7 being explained in detail.

Referring to FIG. 12, the division block receives the primary clock signals p, the phase-regulated value A of the phase regulator 5, the number n of subordinate clock signals u and the output of the frequency divider 9' as inputs. A decision block 17 respectively maintains the current phase-regulated value A' and the current number n' by setting A'=A and n'=n whenever a new value A is present. Both signals A' and n' are respectively further processed in blocks 20 and 21 by being multiplied by the factor 2 (shift operation by 1 bit) and fed as signals 2A' and 2n' to the actual division unit 18. There, the successive addition of 2n' is performed as long as the sum Σ<2A'. This can be carried out d times, the integral division result d and the sum Σ=2*n'*d being determined and led to a further unit 19 for carrying out the rounding.

The rounding is performed in accordance with the following mode of procedure:

firstly addition: $\Sigma + n' = 2*n'*d + n'$ (2)

then rounding: $<= 2*A' \rightarrow D = d+1$ (3)

$> 2*A' \rightarrow D = d$ (4)

In this way, the rounded division result D is provided on the output side as a correction value, D≡A/n being ensured.

A' represents the current phase-regulated value and n' the current number, still to be generated, of subordinate clock signals u. The division by the new and still valid phase-regulated value A"=A'−D of the PLL 6 and the still remaining number n"=n'−1 of subordinate clock pulses is preferably carried out after each generated subordinate clock pulse by the frequency divider 9' for the next subordinate clock pulse to be generated. At the start, A'=A and n'=n.

In order to determine A", the correction value D is therefore led to a subtraction unit 23, where A"=A'−D is determined and fed back to the decision block 17. Thus, the current value n' is likewise reduced by the value one in a further subtraction block 22 to n"=n'−1. The new number n" of subordinate clock pulses u is likewise fed back to the decision block 17. There, with each finally generated subordinate clock pulse u the current phase-regulated value A'=A" and the current number n'=n" are set, whereupon the next division is performed as previously described, etc.

This is performed until n"=0 or a new phase-regulated value A is present. The decision block 17 then sets the values A'=A and n'=n and correction is started anew for the next n subordinate clock pulses u.

The following mode of procedure is then yielded for the above example when the phase-regulated value determined by the PLL is A=A'=100 and the number of subordinate clock pulse signals is n=n'=4, thus leading to a division result of D=25: the first subordinate clock pulse u is corrected by 25; it now holds for the next subordinate clock pulse u that a remaining phase-regulated value A"=A'−D= 100−25=75, and the number of subordinate clock signals still present is n"=−1=3; the next division to be carried out is therefore A"/n"=75/3=25 etc.

The following advantages, inter alia, can be achieved with the aid of the solution according to the present invention. The implemented solution generates virtually ideally equidistant subordinate clock pulses Z which, because of the rounding effect in the period length, differ from one another only by at most one operating clock pulse (for example 10 ns for an operating clock pulse of 100 MHz). In addition, the accuracy of the division is raised by using the first decimal bit for correct rounding up or down. The rounding effects (quantization effects) are thereby distributed virtually uniformly over the subordinate clock pulses Z or a which are to be generated. As a result of the use of a successive addition operation for performing a division operation, the result of the division is required later in time as the duration of the successive addition increases. Therefore, the temporal conflict initially expected between the time for executing the division and the subordinate clock pulses generated in real time does not materialize.

The invention has been described in connection with certain preferred embodiments. It will be appreciated that certain changes and modifications may be made by those skilled in the art without departing from the scope and spirit of the invention which is set forth in the appended claims.

What is claimed is:

1. A synchronization method for a distributed control system including a transmission unit transmitting cyclically emitted synchronization signals, a reception unit receiving and feeding synchronization signals to a clock generator via a phase regulator of a phase-locked loop, the clock generator outputting at least one subordinate clock signal having a plurality of clock pulses occuring between at least first and second synchronization signals, comprising the steps of:
   i determining an instantaneous phase error of at least one subordinate clock signal with respect to said first and second synchronization signals;
   ii calculating a substantially uniform correction value for each clock pulse of said subordinate clock signal; and
   iii correcting said subordinate clock signal based on said correction value such that said instantaneous phase error is substantially uniformly distributed over the pulses of the subordinate clock signal between said first and second synchronization signals.

2. The method of claim 1, wherein said correction value for each subordinate clock signal is calculated by dividing the instantaneous phase-regulated value by a number of clock pulses occurring between said first and second synchronization signals.

3. The method of claim 2, wherein division is performed by a successive addition, comprising maintaining a count as to how often the desired number of subordinate clock signals as divisor fits into the instantaneous phase-regulated value as dividend.

4. The method of claim 3, wherein possible division remainders are likewise distributed virtually uniformly over each of the clock pulses of the at least one subordinate clock signal.

5. The method of claim 4, wherein the division is carried out up to a first decimal position, and a result is rounded off to an integral correction value.

6. The method of claim 5, wherein the division is carried out by successive addition displaced by one bit by multiplying by the value two, and wherein the result is used to decide whether to round up or round down, by virtue of the fact that a last addition possibly exceeding the dividend is repeated without displacement by one bit, and in case when the dividend is exceeded, the determined value is rounded down, or is otherwise rounded up.

7. The method of claim 6, wherein, after each generated subordinate clock pulse, the division is carried out between two synchronization signals for the next subordinate clock pulse to be generated using as dividend the phase correction value reduced by the previous correction value and as divisor the value of a reduced number of subordinate clock pulses.

8. The method of claim 7, comprising the step of integrating the instantaneous phase errors to form an integration value, an integration fraction being smaller than one, and the integration value serving as dividend for generating correction values.

9. The method of claim 8, wherein the instantaneous phase errors are corrected to a proportional value, a proportional fraction being smaller than one and the proportional value serving as dividend for generating correction values.

10. The method of claim 9, wherein the proportional fraction is greater than the integration fraction.

11. The method of claim 10, further comprising the steps of:
   iv generating and downwardly dividing primary clock signals
   v using said downwardly divided primary clock signals as said at least one subordinate clock signal.

12. The method of claim 1, wherein the steps of generating subordinate clock signals and uniformly distributing an instantaneous phase-regulated value over the subordinate clock signals are performed in real time.

13. A reception unit comprising:
   a means for receiving at least two synchronization signals;
   b means, coupled to said receiving means, for generating subordinate clock signals for said at least two synchronization signals;
   c means, coupled to said generating means, determining a set of instantaneous phase errors between said subordinate clock signals and said at least two synchronization signals;
   d means, coupled to said determining means, for determining an instantaneous phase-regulated value for correcting subordinate clock signals; and
   e means, coupled to said determining means, for correcting an instantaneous phase-regulated value, for correcting said subordinate clock signals between said at least two synchronization signals to make subordinate signals essentially equidistant from one another by distributing the instantaneous phase-regulated value virtually uniformly over subordinate clock signals and determining a respective correction value for each subordinate clock signal.

14. A synchronization method for a reception unit comprising the steps of:
   a receiving at least first and second synchronization signals;
   b generating at least one subordinate clock signal having a plurality of clock pulses between said first and second synchronization signals;
   c determining instantaneous phase errors between said subordinate clock signals and said first and second synchronization signals;
   d determining an instantaneous phase-regulated value for correcting said subordinate signals;
   e correcting said subordinate clock signal such that the clock pulses of the subordinate clock signal are essentially equidistant from one another by applying the instantaneous phase-regulated value substantially uniformly over the clock pulses of the subordinate clock signal.

* * * * *